(12) United States Patent
Kim et al.

(10) Patent No.: US 12,543,279 B2
(45) Date of Patent: Feb. 3, 2026

(54) DISPLAY APPARATUS

(71) Applicant: LG Display Co., Ltd., Seoul (KR)

(72) Inventors: Wontae Kim, Paju-si (KR); Sehwan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 265 days.

(21) Appl. No.: 18/527,102

(22) Filed: Dec. 1, 2023

(65) Prior Publication Data

US 2024/0224446 A1 Jul. 4, 2024

(30) Foreign Application Priority Data

Dec. 28, 2022 (KR) ........................ 10-2022-0187613

(51) Int. Cl.
*H05K 5/02* (2006.01)
*H05K 7/20* (2006.01)

(52) U.S. Cl.
CPC ....... *H05K 5/0217* (2013.01); *H05K 7/20963* (2013.01)

(58) Field of Classification Search
CPC .............. H05K 5/0217; H05K 7/20963; G02F 1/13332; G02F 2201/46
See application file for complete search history.

(56) References Cited

U.S. PATENT DOCUMENTS

| | | | |
|---|---|---|---|
| 8,814,414 B2* | 8/2014 | Hsu | G02F 1/133615 |
| | | | 362/97.1 |
| 9,253,932 B2* | 2/2016 | Shives | G02F 1/133382 |
| 2005/0073624 A1* | 4/2005 | Lee | G02F 1/133606 |
| | | | 349/58 |
| 2021/0191184 A1* | 6/2021 | Zhang | G02F 1/133608 |

FOREIGN PATENT DOCUMENTS

| | | | | |
|---|---|---|---|---|
| KR | 10-2022-0084841 A | | 6/2022 | |
| KR | 20220084841 A | * | 6/2022 | ........... G06F 1/1652 |

OTHER PUBLICATIONS

KR-20220084841-A, English translation (Year: 2022).*

* cited by examiner

*Primary Examiner* — Mukundbhai G Patel
(74) *Attorney, Agent, or Firm* — Fenwick & West LLP

(57) ABSTRACT

Disclosed is a display apparatus including: a display panel; a heat dissipation plate on a bottom of the display panel; and a guide holder on a bottom of the heat dissipation plate, wherein the heat dissipation plate includes a first base, and a first protrusion protruding toward the guide holder, and the guide holder includes a second base, and second protrusions protruding from an end portion of the second base.

18 Claims, 18 Drawing Sheets

DISPLAY APPARATUS

CROSS-REFERENCE TO RELATED APPLICATION

The present application claims the benefit to Republic of Korea Patent Application No. 10-2022-0187613, filed on Dec. 28, 2022, which is hereby incorporated by reference in its entirety.

BACKGROUND

Technical Field

The disclosure relates to a display apparatus.

Description of the Related Art

Entering an information age, the field of display that expresses an electrical information signal visually has recently been developed rapidly, and thus various display apparatuses have been developed to have excellent performance such as thinness, light weight, and low power consumption.

Examples of the display apparatus are a liquid crystal display (LCD) apparatus, an organic light emitting display (OLED) apparatus, a quantum dot display apparatus, etc.

Such a display apparatus has recently been widely used in vehicles.

SUMMARY

An aspect of the disclosure is to provide a display apparatus improved in maintaining its curvature.

According to an embodiment of the disclosure, a display apparatus includes: a display panel; a heat dissipation plate on a bottom of the display panel; and a guide holder on a bottom of the heat dissipation plate, wherein the heat dissipation plate includes a first base, and a first protrusion protruding toward the guide holder, and the guide holder includes a second base, and second protrusions protruding from an end portion of the second base.

According to another embodiment of the disclosure, a display apparatus includes: a curved heat dissipation plate; and a curved guide holder on a bottom of the curved heat dissipation plate, wherein the curved heat dissipation plate includes a first base, and a first protrusion protruding toward the curved guide holder, and the curved guide holder includes a second base, and second protrusions protruding from an end portion of the second base.

Details of other embodiments are included in the detailed description and the accompanying drawings.

According to embodiments, a display apparatus is improved in maintaining its curvature. Thus, alignment failure is reduced when a back cover and a guide holder are fastened to each other.

The effects of the embodiments are not limited by the foregoing description, and various effects are further involved in the disclosure.

DETAILED DESCRIPTION

Figure 1:
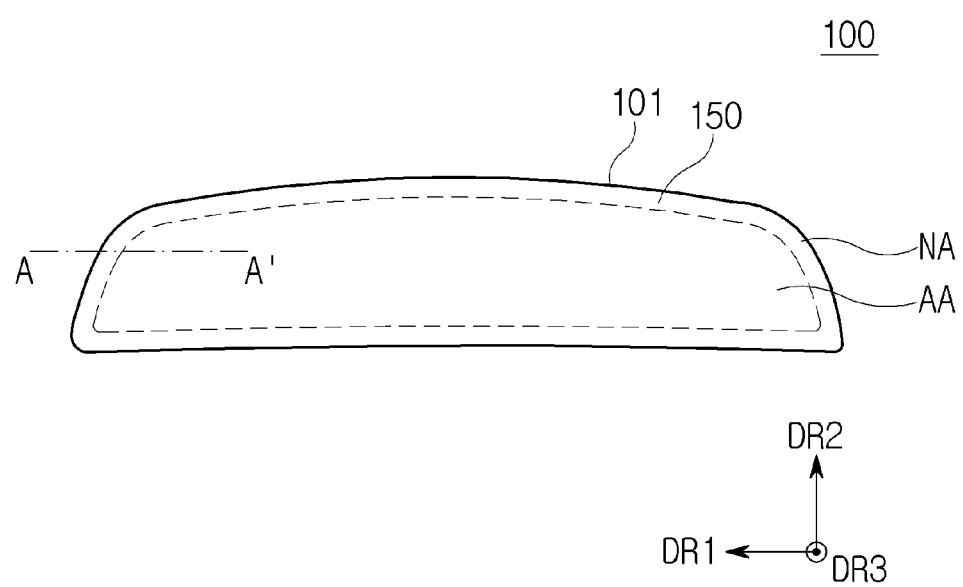
FIG. 1 is a perspective view of a display apparatus according to an embodiment.

Advantages and features of the disclosure and methods of accomplishing the same may be understood more readily by reference to the detailed description of embodiments that will be made hereinafter with reference to the accompanying drawings. The disclosure may, however, be embodied in many different forms and should not be construed as being limited to the exemplary embodiments set forth herein; rather, these exemplary embodiments are provided so that the disclosure will be thorough and complete and will fully convey the concept of the disclosure to those skilled in the art, and the present disclosure will only be defined by the appended claims.

The shapes, sizes, ratios, angles, numbers and the like illustrated in the drawings to describe embodiments of the disclosure are merely exemplary, and thus, the disclosure is not limited thereto. Throughout the specification, the same reference numerals refer to the same components. In addition, detailed descriptions of well-known technologies may be omitted in the disclosure to avoid obscuring the subject matter of the disclosure. When terms such as "comprises," "has," or "includes," are used in this specification, it should be understood that unless "only" is specifically used, additional elements or steps can be included. Unless otherwise explicitly stated, when a component is expressed in the singular form, it is intended to encompass the plural form as well.

In interpreting the components, it is construed to include a margin of error even in the absence of explicit description.

When describing the positional relationship, for example, when the relationship between two parts is described as "on", "on top of", "underneath", "beside", etc., unless "directly" or "immediately" is used, one or more other parts may be located between the two parts.

When a device or layer is referred to as being "on" another device or layer, it includes cases where one device or layer is directly located on the other device or layer or still other device or layer is interposed between the two devices or layers.

Although the terms "first", "second", and the like are used to describe various components, these components are not limited by these terms. These terms are merely used for distinguishing one component from the other components. Therefore, the first component mentioned hereinafter may be the second component in the technical sense of the disclosure.

Throughout the specification, the similar reference numerals refer to the similar components.

The sizes and thicknesses of each component shown in the drawings are presented for the convenience of description and are not intended to limit the disclosure.

The features of various embodiments of the disclosure can be partially or entirely combined or assembled in various technical manners of interlocking and interoperation obvious to those skilled in the art, and each embodiment can be implemented independently or in combination with related embodiments.

Hereinafter, detailed descriptions are made of the embodiments of the disclosure with reference to the accompanying drawings.

In the disclosure, the term "display apparatus" is used in a narrow sense to refer to display apparatuses, such as a liquid crystal module (LCM), an organic light-emitting diode (OLED) module, and a quantum dot module, each including a display panel and a panel driver to operate the display panel. In addition, the term may also be used to refer to set electronic devices, set devices, or apparatuses that include LCMs, OLED modules, QD modules, and the like, such as equipment display apparatuses including complete or final products such as laptop computers, televisions, computer monitors, automotive displays or equipment displays provided in other forms for vehicles, as well as mobile electronic devices such as smartphones or electronic pads.

Accordingly, in the disclosure, the display apparatus may include not only the display apparatuses in the narrow sense themselves, such as LCMs, OLED modules, QD modules, but also set devices as application products or final consumer devices including LCMs, OLED modules, QD modules, and the like.

Additionally, in some cases, an LCM, an OLED module, or a QD module, composed of a display panel and a panel driver may be referred to as "display apparatus" in a narrow sense, while an electronic device as a complete product including an LCM, an OLED module, or a QD module may be referred to as "set device". For example, the narrow-sense display apparatus may include a display panel of liquid crystal (LCD), organic light-emitting diode (OLED), or quantum dot (QD) and a source printed circuit board (PCB) as a controller for driving the display panel, while a set device may further include a set PCB, serving as a set controller that is electrically connected to the source PCB and controls the entire set device.

The display panel used in the embodiments may include all types of display panels such as liquid crystal display panels, organic light-emitting diode (OLED) display panels, quantum dot (QD) display panels, and electroluminescent display panels, and is not limited to a specific display panel capable of bending a bezel with a flexible substrate for OLED display panel and a backplate support structure thereunder. In addition, the display panel used in the embodiments of the disclosure is not limited to the shape or size of the display panel.

For example, when the display panel is an organic light-emitting diode (OLED) display panel, it may include a plurality of gate lines and data lines and pixels formed at the intersection of the gate lines and data lines. In addition, it may be configured to include an array including thin-film transistors as components for selectively applying the voltage to each pixel, an organic light-emitting diode (OLED) layer on the array, an encapsulation substrate or encapsulation layer arranged on the array to cover the organic light-emitting diode layer, etc. The encapsulation layer may protect the thin film transistors and the organic light-emitting diode layer from the external impacts and prevent moisture or oxygen from penetrating into the organic light-emitting diode layer. In addition, the layers formed on the array may for example include an inorganic light-emitting layer, such as a nano-sized material layer or quantum dots.

In the disclosure, a display panel illustrates an exemplary organic light emitting diode (OLED) display panel that may be integrated within display apparatuses.

FIG. 1 is a diagram illustrating a display apparatus 100 according to an embodiment.

Referring to FIG. 1, the display apparatus 100 may be applied to a TV, a monitor, a PC, the center fascia of a vehicle, etc. According to an embodiment, the display apparatus 100 may be applied to the center fascia of the vehicle. FIG. 1 illustrates the display apparatus 100 having a trapezoidal shape of which edges are rounded. However, without limitation, the display apparatus 100 may be shaped like a rectangle or polygon with angled edges, a rectangle or polygon with rounded edges, or an ellipse or circle. Below, the display apparatus 100 shaped like a trapezoid with rounded edges will be described.

Further, the display apparatus 100 according to an embodiment may be a curved display apparatus. For example, the display apparatus 100 has long sides (or long side edges) extending along a first direction DR1, and short sides (or short side edges) extending approximately along a second direction DR2, and the display apparatus 100 according to an embodiment may be a curved display apparatus having the long sides bent in a third direction DR3. In the case of the curved display apparatus 100, the foregoing members of the display apparatus 100 to be described below may also be curved according to the curvature of the display apparatus 100. Accordingly, the members of the display apparatus 100 to be described later may be referred to with "curved" prefixed thereto.

Referring to FIG. 1, the display apparatus 100 includes a cover window 101 and a display panel 150. The cover window 101 may be formed of a glass or plastic material to protect the display panel 150 from external shock.

The display panel 150 is formed beneath the cover window 101, and coupled to the cover window 101 through an adhesive member. The display panel 150 may include a polarization plate, a panel layer, and a touch panel. In particular, when the display panel 150 is an in-vehicle display panel, a viewing angle control film for controlling a viewing angle by controlling light emitted toward a driver may be added. Such a viewing angle control film is a particular form the display apparatus 100 mounted to a vehicle. In particular, the display apparatus 100 that has recently been mounted to a vehicle is disposed in the front of a driver seat to display a speedometer or the like, disposed at the center to display a navigation or the like, and disposed in the front of a passenger seat to display a multimedia to an occupant who is seated in the passenger seat. Further, recently, an integrated display apparatus 100 is formed from the front of the driver seat to the front of the passenger seat via the center. Therefore, the viewing angle control film is essential to avoid the transfer of an image displayed for the passenger seat to a driver.

The display apparatus 100 includes a display area AA where a user can view a video or image in the front thereof, and a non-display area NA where an image is not displayed. Such a non-display area NA may also be referred to as a bezel area.

Figure 2:
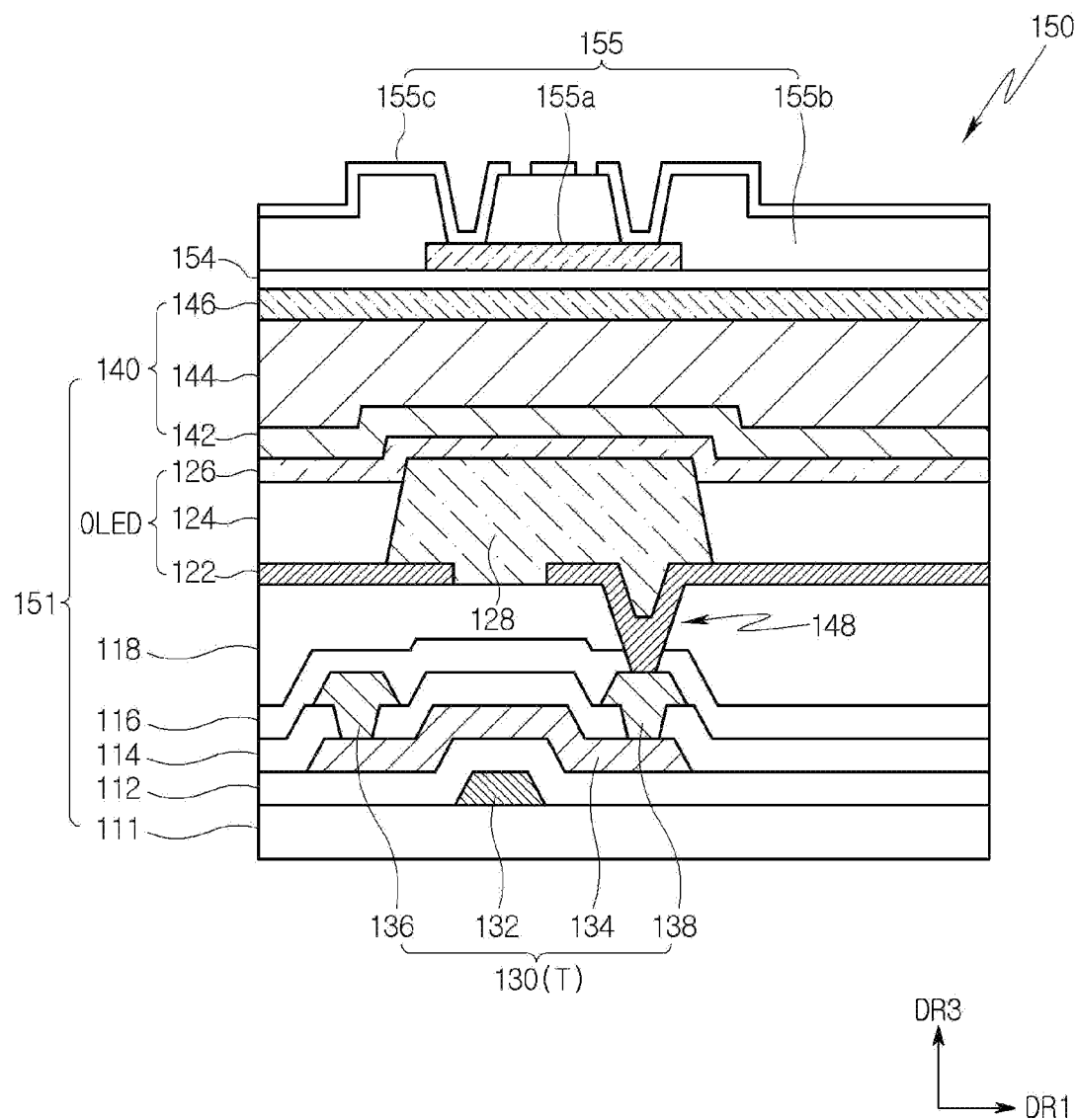
FIG. 2 is a cross-sectional view of a display panel according to an embodiment.

FIG. 2 is a cross-sectional view of a display panel according to an embodiment.

Referring to FIG. 2, a substrate 111 is disposed at the bottom of the display panel 150. The substrate 111 may support various components of the display panel 150. The substrate 111 may be formed of a transparent dielectric material such as glass, plastic, and the like. In the case of being formed of plastic, the substrate 111 may be a plastic film or a plastic substrate. For example, the substrate 111 may take the form of a film including one of the polyimide-based polymers, polyesters-based polymers, silicone-based polymers, acrylic-based polymers, polyolefin-based polymers, and their copolymers. Among these materials, polyimide is mainly used as a plastic substrate because it is suitable for high-temperature processes and is a material that can be coated.

A buffer layer may be positioned on the substrate 111. The buffer layer is a functional layer that protects the thin-film transistor (TFT) from impurities such as alkali ions that may leak from the bottom of the substrate 111. The buffer layer may be formed of silicon oxide (SiOx), silicon nitride (SiNx), or multiple layers thereof.

Thin film transistor 130 (T) may be disposed on the buffer layer. The thin film transistor 130 may be formed by sequentially arranging a gate electrode 132, a gate insulating layer 112, a semiconductor layer 134, an interlayer insulating film 114, and source and drain electrodes 136 and 138 on the buffer layer. There may be one or more thin film transistors 130 arranged for a plurality of sub-pixels provided in the active area.

Although illustrated as the bottom-gate type in FIG. 2, the thin film transistor 130 is not limited thereto and may also be provided as the top-gate type, in which the order of the semiconductor layer 134 and the gate electrode 132 are reversed.

The semiconductor layer 134 may be arranged at a specific portion on the substrate 111 or on the buffer layer. The semiconductor layer 134 may be made of polycrystalline silicon (p-Si), and in this case, a partial region of the semiconductor layer 134 may be doped with impurities to form the electrode layer. The semiconductor layer 134 may also be made of amorphous silicon (a-Si) and various organic semiconductor materials such as pentacene. Furthermore, the semiconductor layer 134 may also be made of an oxide material. The gate insulating layer 112 may be formed of inorganic dielectric materials such as silicon oxide (SiOx) or silicon nitride (SiNx) and organic dielectric materials. The gate electrode 132 may be formed of various conductive materials, such as magnesium (Mg), aluminum (Al), nickel (Ni), chromium (Cr), molybdenum (Mo), tungsten (W), gold (Au), or alloys thereof.

The first interlayer insulating film 114 may be formed of inorganic dielectric materials such as silicon oxide (SiOx) or silicon nitride (SiNx) and, as well, organic dielectric materials. The first interlayer insulating film 114 may be selectively removed to form contact holes exposing the source and drain regions.

The source and drain electrodes 136 and 138 are formed as a single layer or multilayer of electrode material on the first interlayer insulating film 114.

An inorganic protective film 116 and a planarization layer 118 may be positioned on the thin film transistor 130 to cover the source and drain electrodes 136 and 138. The inorganic protective film 116 and the planarization layer 118 protect the thin film transistor 130 and flatten the upper surface thereof.

The inorganic protective film 116 may be formed of inorganic dielectric films such as silicon nitride (SiNx) and silicon oxide (SiOx), while the planarization layer 118 may be made of organic dielectric films such as benzocyclobutene (BCB) or acrylic (Acryl). The inorganic protective film 116 and the planarization layer 118 may each be formed as a single layer, dual-layer, or multilayer structure, and in some cases, one of the two layers may be omitted.

A light-emitting component OLED connected to the thin film transistor (TFT) 130 may be formed by sequentially arranging a first electrode 122, an organic light-emitting layer 124, and a second electrode 126. That is, the light-emitting component OLED may be composed of the first electrode 122 connected to the drain electrode 138 through a connection hole 148 formed in the planarization layer 118 and the inorganic protective film 116, the organic light-emitting layer 124 positioned on the first electrode 122, and the second electrode 126 positioned on the organic light-emitting layer 124.

When the display panel 150 is of a top emission type where the emission occurs upward through the second electrode 126, the first electrode 122 may include an opaque conductive material with high reflectivity. In this case, examples of the reflective conductive material may include silver (Ag), aluminum (Al), gold (Au), molybdenum (Mo), tungsten (W), chromium (Cr), or alloys thereof.

A bank 128 is formed in the area excluding the light-emitting area, opening up the light-emitting area. Accordingly, the bank 128 has a bank hole exposing the first electrode 122 corresponding to the light-emitting area. The bank 128 may be made of inorganic dielectric materials such as silicon nitride (SiNx) and silicon oxide (SiOx), or organic dielectric materials such as BCB, acrylic-based resins, or imide-based resins.

The organic light-emitting layer 124 is positioned on the first electrode 122 exposed by the bank 128. The organic light-emitting layer 124 may include a hole injection layer, a hole transport layer, an emissive layer, an electron transport layer, and an electron injection layer. In addition, the organic light-emitting layer 124 may be composed of a single emissive layer structure that emits a single light within a single stack, or a multi-stack structure including multiple stacks, each of which includes a single emissive layer of the same color. In such cases, adjacent sub-pixels may be arranged to emit different colors of light to display various colors. For example, sub-pixels with emissive layers of red, green, and blue may be arranged in a row or spaced apart from each other and, in a triangle shape or pentile structure with some sub-pixels of predetermined colors aligned in parallel and others aligned diagonally to each other.

In some cases, sub-pixels of white color may also be added to the arrangement. In addition, the organic light-emitting layer 124 may be configured by stacking a plurality of stacks including emissive layers emitting different colors of light to express white. In the case of expressing white with a stacked structure, separate color filters may be additionally added to each sub-pixel.

The second electrode 126 is positioned on the organic light-emitting layer 124. When the display panel 150 adopts a top emission structure, the second electrode 126 may be formed of a transparent conductive material such as indium tin oxide (ITO) or indium zinc oxide (IZO) or a semi-transparent metal or metal alloy such as Mg and Ag to emit light generated in the organic light-emitting layer 124 upward through the second electrode 126.

The second electrode 126 may be arranged to reach a capping layer. The capping layer may protect the OLED and assist in the extraction of light emitted through the second electrode 126 by using a material with a high refractive index.

An encapsulation layer 140 may be disposed on the light-emitting component OLED. The encapsulation layer 140 prevents the infiltration of oxygen and moisture from the outside to prevent oxidation of the emissive and electrode materials. Exposure of OLED to moisture or oxygen may cause pixel shrinkage or the formation of dark spots, reducing the emitting area. The encapsulation layer 140 is formed by alternately stacking inorganic layers 142 and 146 made of glass, metal, aluminum oxide (AlOx), or silicon (Si) materials and an organic layer 144 that serves as a buffer relieving the stress between layers due to the bending of the display apparatus 100 (see FIG. 1) and enhances the flattening performance. The organic layer 144 may be made of organic dielectric materials such as acrylic resin, epoxy resin, polyimide, polyethylene, or silicon oxycarbide (SiOC). Here, the first and second inorganic layers 142 and 146 serve to block the penetration of moisture or oxygen, while the organic layer 144 flattens the surface of the first inorganic layer 142. The encapsulation layer 140 is composed of several thin film layers to increase the length and complexity of the path that moisture and oxygen must travel compared to a single layer, with the purpose of making it difficult for moisture and oxygen to penetrate to the light-emitting component OLED.

A protective layer may be formed further between the light-emitting component OLED and the encapsulation layer 140 to protect the encapsulation layer 140 from being peeled off or affecting the uniformity during the manufacturing process of the encapsulation layer 140.

Referring to FIG. 2, a polarization layer 154 may be disposed on the encapsulation layer 140. The polarization layer 154 may minimize the impact of light entering the display panel 150 from external light sources on the semiconductor layer 134 or the organic light-emitting layer 124.

Referring to FIG. 2, a touch sensor layer 155 may be arranged on the polarization layer 154. The touch sensor layer 155 may be structured with the first touch electrode 155a and the second touch electrode 155c intersecting each other, allowing one electrode to receive an applied voltage signal and the other to sense the voltage signal. The first touch electrode 155a and the second touch electrode 155c may be patterned into polygonal or circular shapes on a touch insulation film 155b to be arranged at a distance from each other.

A cover window 101 may be disposed on the touch sensor layer 155. An adhesive layer is further disposed between the touch sensor layer 155 and the cover window 101 to bond them together.

Figure 3:
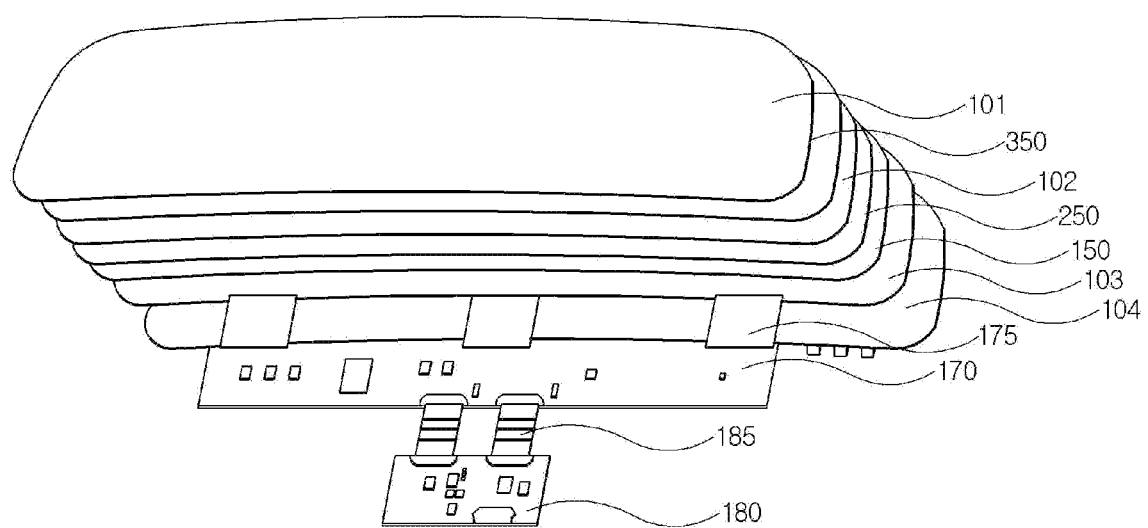
FIG. 3 is an exploded perspective view of a display apparatus according to an embodiment.
Figure 4:
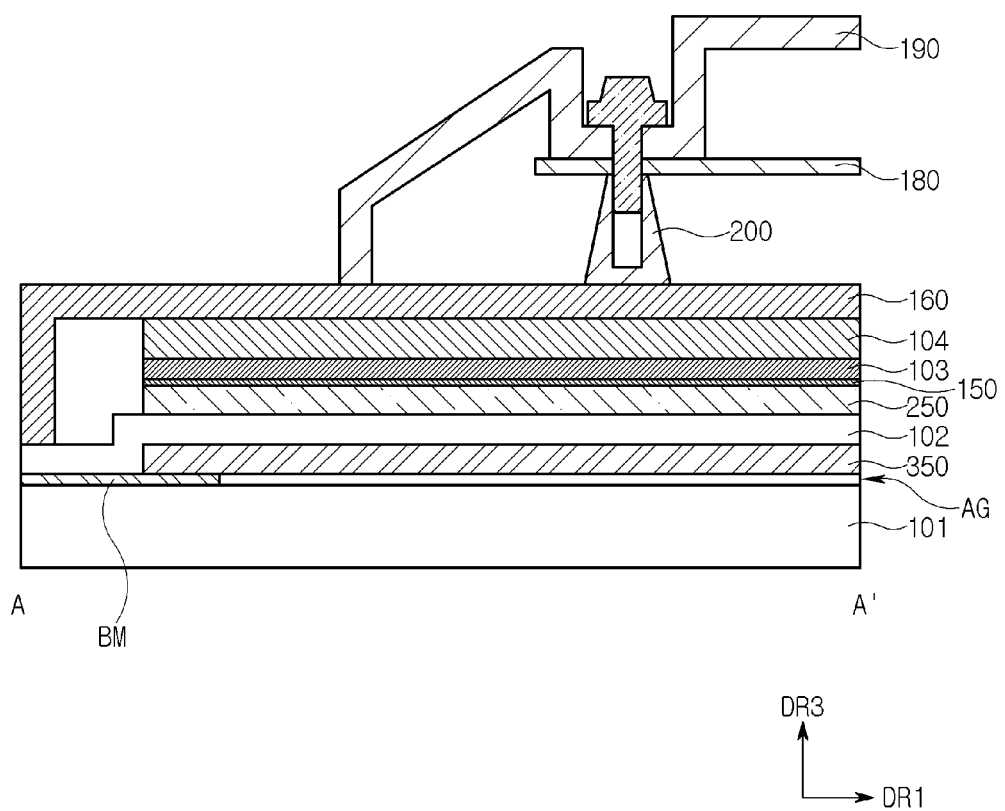
FIG. 4 is a cross-sectional view of a display apparatus taken along line A-A' in FIG. 1, according to an embodiment of the present disclosure.
Figure 5:
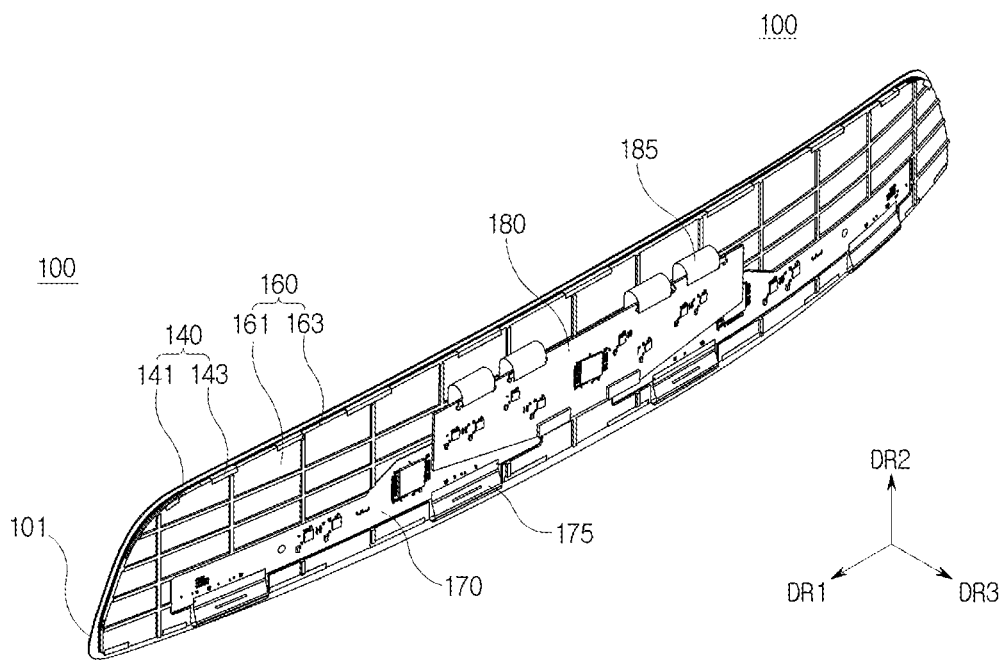
FIG. 5 is a perspective view showing the rear side of a display apparatus according to an embodiment.
Figure 6:
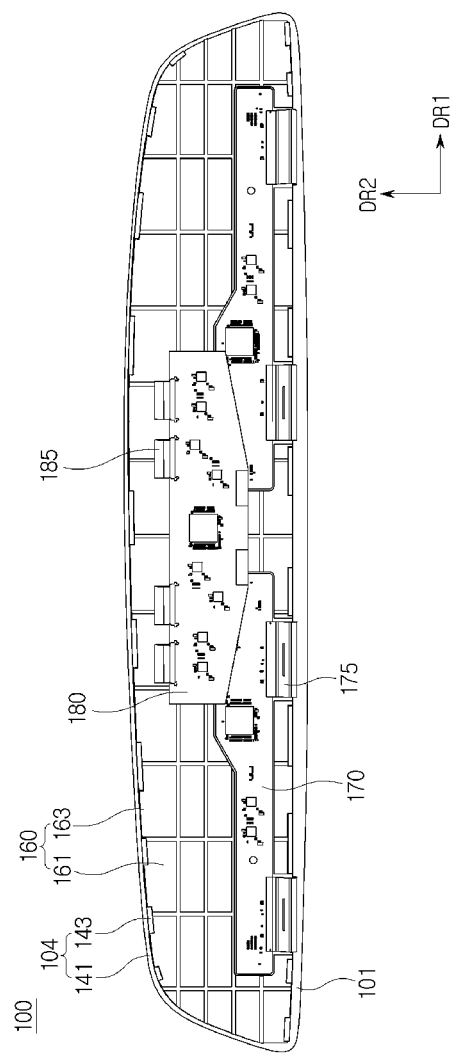
FIG. 6 is a plan view showing the rear side of the display apparatus of FIG. 5, according to an embodiment of the present disclosure.

FIG. 3 is an exploded perspective view of a display apparatus according to an embodiment. FIG. 4 is a cross-sectional view of a display apparatus taken along line A-A' in FIG. 1, according to an embodiment of the present disclosure. FIG. 5 is a perspective view showing the rear side of a display apparatus according to an embodiment. FIG. 6 is a plan view showing the rear side of the display apparatus of FIG. 5, according to an embodiment of the present disclosure.

FIG. 3 illustrates that the cover window 101 is positioned at the top, and FIGS. 4 and 5 illustrate that the cover window 101 is disposed at the bottom. It should be noted that upper and lower portions in this disclosure are relative concepts to mean upper and lower portions with respect to the drawings desired to be described and do not mean the upper and lower portions in the actual product. FIG. 3, in fact, depicts that a guide holder 160 is removed. FIGS. 5 and 6 depict that the guide holder 160 covers the cover window 101. As shown in the cross-sectional views of FIGS. 3 and 4, a viewing angle control layer 350, an adhesive member 102, a polarization film 250, the display panel 150, a back plate 103, a heat dissipation plate 104 and the like component may further be disposed between the cover window 101 and the guide holder 160. However, these components have a thickness of a few millimeters, and are thus omitted in FIGS. 5 and 6.

Further, as shown in FIG. 4, a back cover 190 may further be disposed on the guide holder 160. To describe the rear of the display apparatus 100 in detail, the back cover 190 is removed in FIGS. 3, 5 and 6.

The display apparatus 100 according to an embodiment of the disclosure may include the cover window 101, the viewing angle control layer 350, the adhesive member 102, the polarization film 250, the display panel 150, the back plate 103, the heat dissipation plate 104, the guide holder 160, a source printed circuit board 170, and a control printed circuit board 180.

The cover window 101 may be disposed on the front surface of the display panel 150 and made of, but not limited to, a glass material having high strength. Further, the cover window 101 may include the display area AA (see FIG. 1) and the non-display area NA (see FIG. 1). The display area AA may be an area corresponding to the display panel 150, and the non-display area NA may correspond to the bezel area. The bezel area may be formed with a light shielding pattern BM. Therefore, the display apparatus 100 may include the light shielding pattern BM formed at four edges of the upper, lower, left, and right sides when viewed from the front.

The viewing angle control layer 350 serves to control a direction of light emitted from the display panel 150 and may be disposed on the side of the cover window 101, i.e., the front end of the display panel 150. In particular, the display apparatus 100 mounted to a vehicle may need to be controlled to selectively emit light to a driver or not to emit light. In this way, the viewing angle control layer 350 may selectively control the path of light emitted from the display panel 150. The viewing angle control layer 350 will be described later in detail with reference to FIGS. 13 and 14.

The adhesive member 102 serves to bond the cover window 101 and the viewing angle control layer 350 to each other. In addition, the adhesive member 102 serves to bond the polarization film 250 to the viewing angle control layer 350. The adhesive member 102 may include a transparent material, for example, an optical clear adhesive (OCA) or a pressure sensitive adhesive (PSA).

The polarization film 250 is disposed on the adhesive member 102. The polarization film 250 serves to polarize the light emitted from the display panel 150.

The display panel 150 is disposed on the polarization film 250. The display panel 150 emits light for displaying a video or image, and internally includes a plurality of pixels and transistors for driving the pixels. The detailed structure of the display panel 150 is the same as exemplarily described with reference to FIG. 2.

The back plate 103 is disposed on the display panel 150. The back plate 103 may serve as a rigid structure to reinforce the rigidity of the display panel 150. The back plate 103 may be formed of a plastic thin film.

The heat dissipation plate 104 is disposed on the back plate 103. The heat dissipation plate 104 may serve to dissipate heat generated in the display panel 150 or the printed circuit boards 170 and 180. The heat dissipation plate 104 may include aluminum, magnesium or the like metal material, or a plastic material excellent in thermal conductivity.

The guide holder 160 is disposed on the heat dissipation plate 104. The guide holder 160 may serve to protect the components positioned below, and support the control printed circuit board 180. To support the control printed circuit board 180, the guide holder 160 may include a substrate supporting block 200. The guide holder 160 may be formed of a metal or plastic material.

The back cover 190 (see FIG. 4) may be disposed on the bottom of the guide holder 160. The back cover 190 may serve to protect the printed circuit boards 170 and 180 positioned below. The back cover 190 may be screw-coupled to the guide holder 160. The back cover 190 may be formed of a metal or plastic material.

The guide holder 160 may be disposed on the top surface of the display panel 150. According to an embodiment, the guide holder 160 may be made of, but not limited to, an aluminum material excellent in thermal conductivity. For example, the guide holder 160 may include a synthetic metal material including magnesium. Further, the guide holder 160 may be made of a plastic material.

The guide holder 160 may be bonded to the rear of the display panel 150. Therefore, the guide holder 160 may function as a heat dissipation plate to dissipate and remove heat from the display panel 150.

The guide holder 160 may be fabricated to perform a function of holding the source printed circuit board 170 and the control printed circuit board 180 as well. For example, the guide holder 160 may include a substrate supporting block 200, and the control printed circuit board 180 may be disposed on the substrate supporting block 200. There may be a plurality of such substrate supporting blocks 200.

The source printed circuit board 170 may be disposed on the rear of the guide holder 160, and the source printed circuit board 170 may be connected to the display panel 150 by a flexible circuit board 175. The flexible circuit board 175 may be provided as a chip on film (COF) and internally include a source driver integrated circuit (IC).

The control printed circuit board 180 may be disposed in the substrate supporting block 200 formed in the guide holder 160, and connected to the source printed circuit board 170 by a flat cable 185. Specifically, a first connector disposed in the source printed circuit board 170 and a second connector disposed in the control printed circuit board 180 are connected by a flat cable 185, so that the control printed circuit board 180 can control the source printed circuit board 170.

The back cover 190 may be disposed on the guide holder 160, and coupled to the guide holder 160 by, for example, a screw, while surrounding and protecting the source printed circuit board 170 and the control printed circuit board 180. The back cover 190 may be made of, but not limited to, a synthetic metal material including magnesium or a polycarbonate (PC) material. For example, the back cover 190 may be made of a plastic material.

According to an embodiment, the cover window 101, the viewing angle control layer 350, the adhesive member 102, the polarization film 250, the display panel 150, the back plate 103, the heat dissipation plate 104, and the guide holder 160 may have respective curved shapes according to the curvature of the display apparatus 100.

Figure 7:
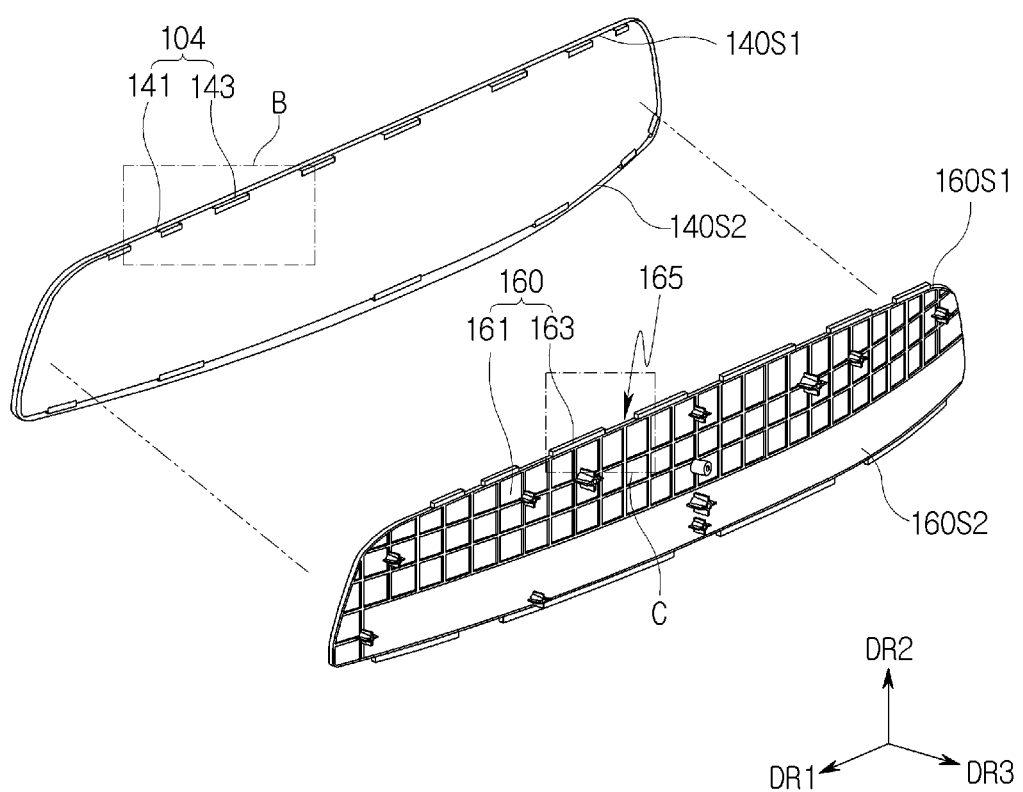
FIG. 7 is an exploded perspective view of a heat dissipation plate and a guide holder according to an embodiment.
Figure 8:
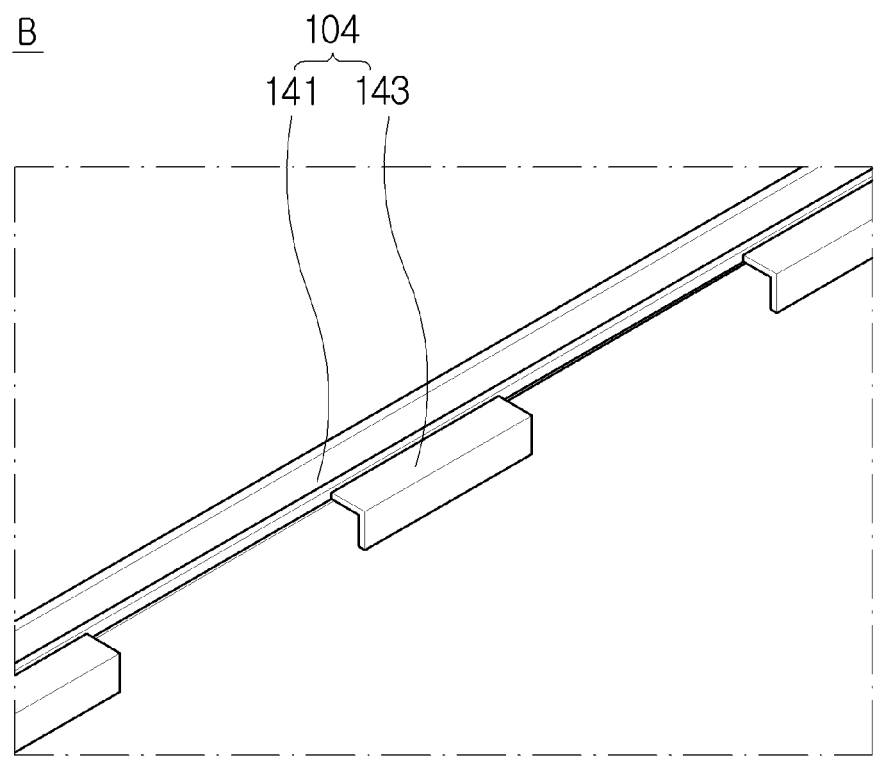
FIG. 8 is an enlarged perspective view of a region B in FIG. 7, according to an embodiment of the present disclosure.
Figure 8:
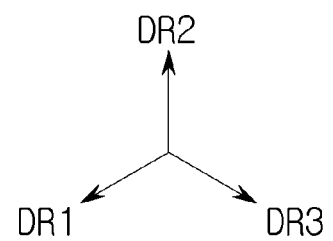
Figure 9:
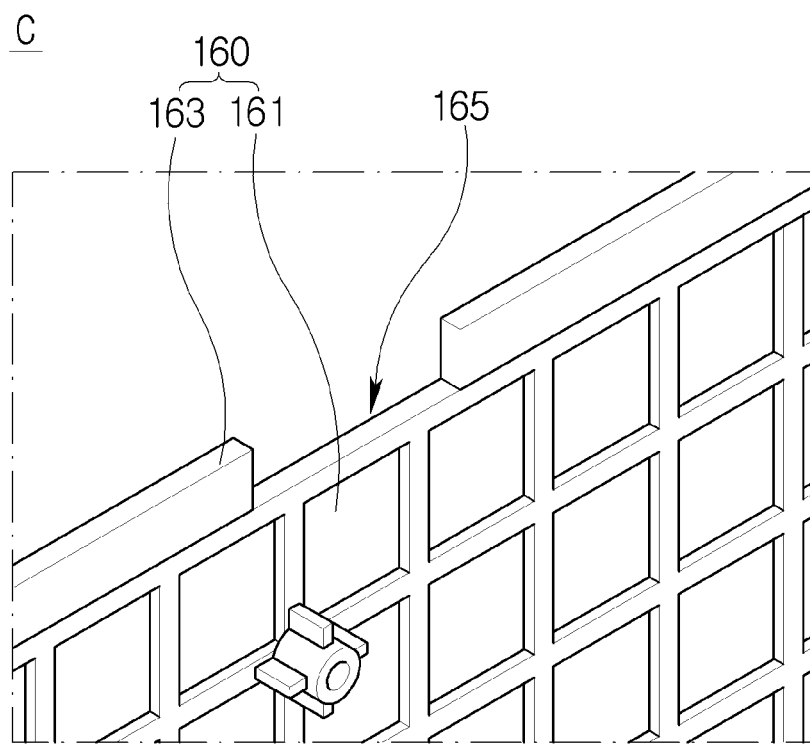
FIG. 9 is an enlarged perspective view of a region C in FIG. 7, according to an embodiment of the present disclosure.

FIG. 7 is an exploded perspective view of a heat dissipation plate and a guide holder according to an embodiment. FIG. 8 is an enlarged perspective view of a region B in FIG. 7, according to an embodiment of the present disclosure. FIG. 9 is an enlarged perspective view of a region C in FIG. 7, according to an embodiment of the present disclosure.

Referring to FIGS. 7 to 9 along with FIGS. 5 and 6, the heat dissipation plate 104 according to an embodiment may include a first base 141 and a first protrusion 143 protruding from the first base 141 toward a guide holder 160, and the guide holder 160 according to an embodiment may include a second base 161 and a second protrusion 163 protruding from an end portion of the second base 161.

As illustrated in FIG. 7, the heat dissipation plate 104 may have long sides 140S1 extending approximately along the first direction DR1, and short sides 140S2 connecting the long sides 140S1. In this disclosure, the long side 140S1 extending approximately along the first direction DR1 may mean that the long side 140S1 extends along the first direction DR1 when the display apparatus 100 (see FIG. 1) is not curved but straightened, but the long side 140S1 is curved with respect to the third direction DR3 when the display apparatus 100 is curved. As described above with reference to FIG. 1, the display apparatus 100 according to an embodiment has, for example, a trapezoidal shape with rounded edges, and thus the lower long side 140S1 of the heat dissipation plate 104 may be longer than the upper long side 140S1. Likewise, the guide holder 160 may have long sides 160S1 extending approximately along the first direction DR1, and short sides 160S2 connecting the long sides 160S1.

The first protrusion 143 of the heat dissipation plate 104 may protrude from the long side 140S1 of the heat dissipation plate 104 toward the guide holder 160. There may be a plurality of first protrusions 143, and the plurality of first protrusions 143 may be disposed as spaced apart from each other along the extending direction of the long side 140S1 of the heat dissipation plate 104. The first protrusions 143 may be formed in the upper long side 140S1 and lower long side 140S1 of the heat dissipation plate 104, respectively.

The second protrusion 163 of the guide holder 160 may protrude from the second base 161 toward the second direction DR2. There may be a plurality of second protrusions 163. The second protrusions 163 may be formed in the upper long side 160S1 and the lower long side 160S1 of the guide holder 160, respectively. The second protrusions 163 protruding from the upper long side 160S1 may protrude upwards, and the second protrusions 163 protruding from the lower long side 160S1 may protrude downwards.

As shown in FIG. 8, the first protrusion 143 may have a '⌐'-shape. However, the shape of the first protrusion 143 is not limited to the '⌐'-shape, and may also be shaped like a bar extending approximately along the first direction DR1.

As shown in FIG. 9, a space 165 may be formed between the second protrusions 163 spaced apart from each other.

Figure 10:
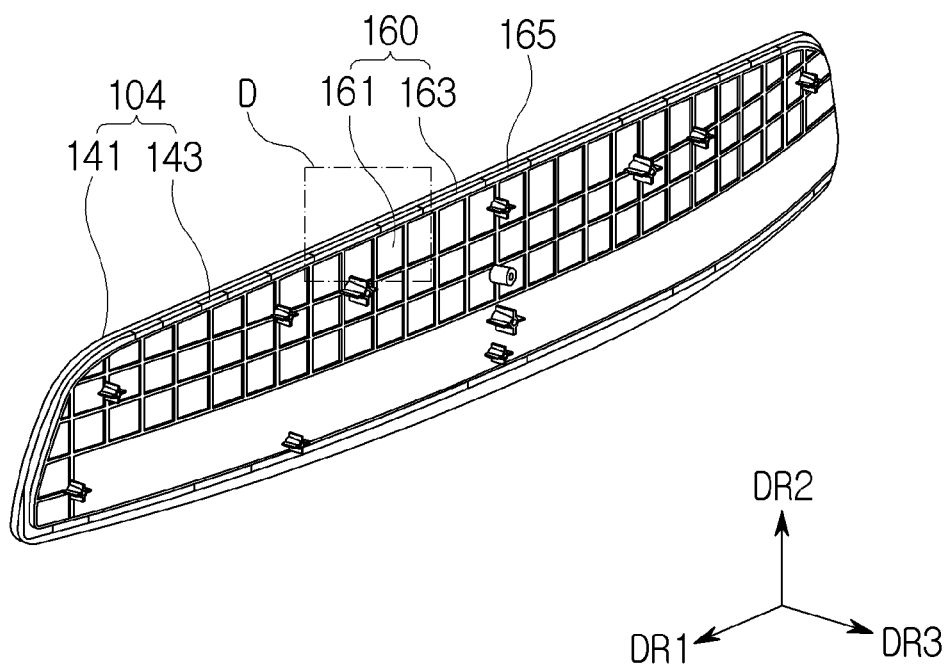
FIG. 10 is a perspective view showing that the heat dissipation plate and the guide holder of FIG. 7 are coupled, according to an embodiment of the present disclosure.
Figure 11:
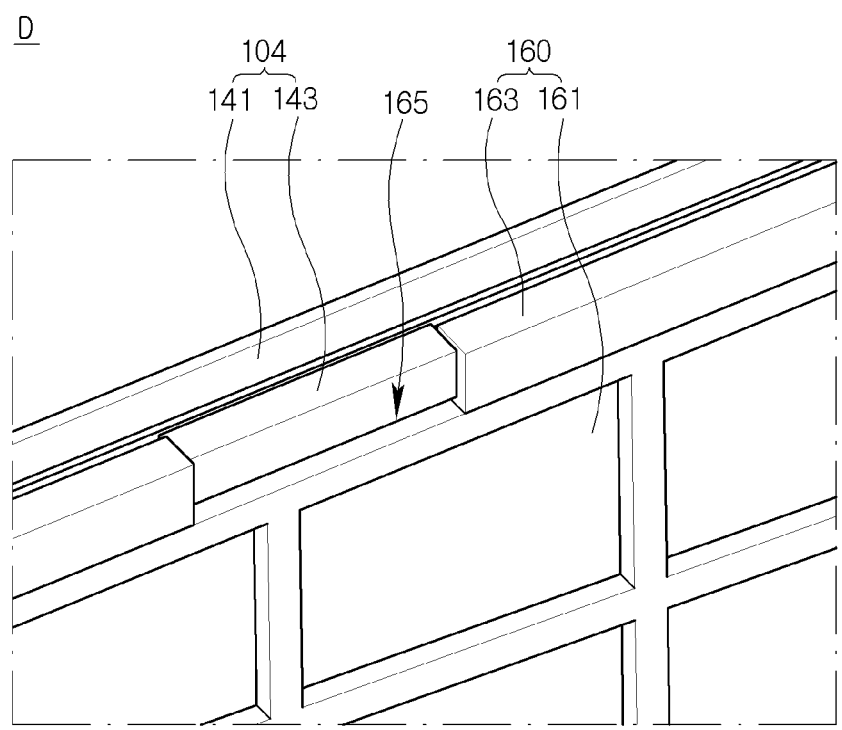
FIG. 11 is an enlarged perspective view of a region D in FIG. 10, according to an embodiment of the present disclosure.

FIG. 10 is a perspective view showing that the heat dissipation plate and the guide holder of FIG. 7 are coupled, according to an embodiment of the present disclosure. FIG. 11 is an enlarged perspective view of a region D in FIG. 10, according to an embodiment of the present disclosure.

The first protrusion 143 of the heat dissipation plate 104 shown in FIGS. 10 and 11 may be inserted in the space 165 formed in the guide holder 160. The first protrusion 143 inserted in the space 165 may be in contact with each of the second protrusions 163 of the adjacent guide holders 160. The first protrusion 143 may be in direct contact with the adjacent second protrusions 163.

Figure 12:
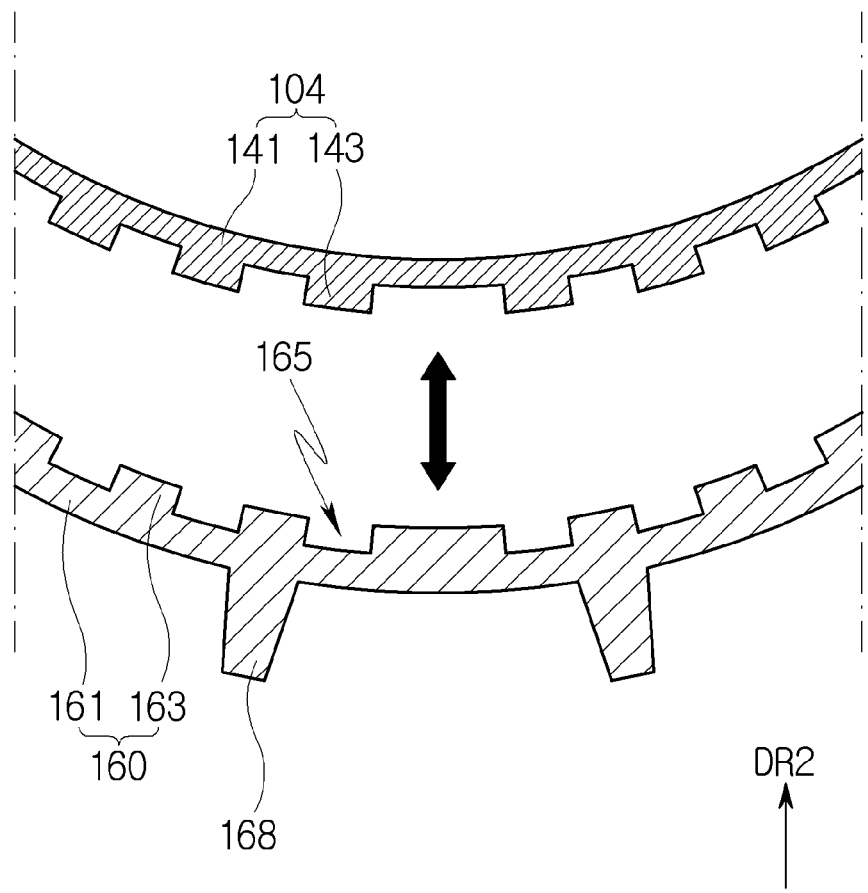
FIGS. 12 and 13 are views for describing coupling between a heat dissipation plate and a guide holder according to an embodiment.
Figure 13:
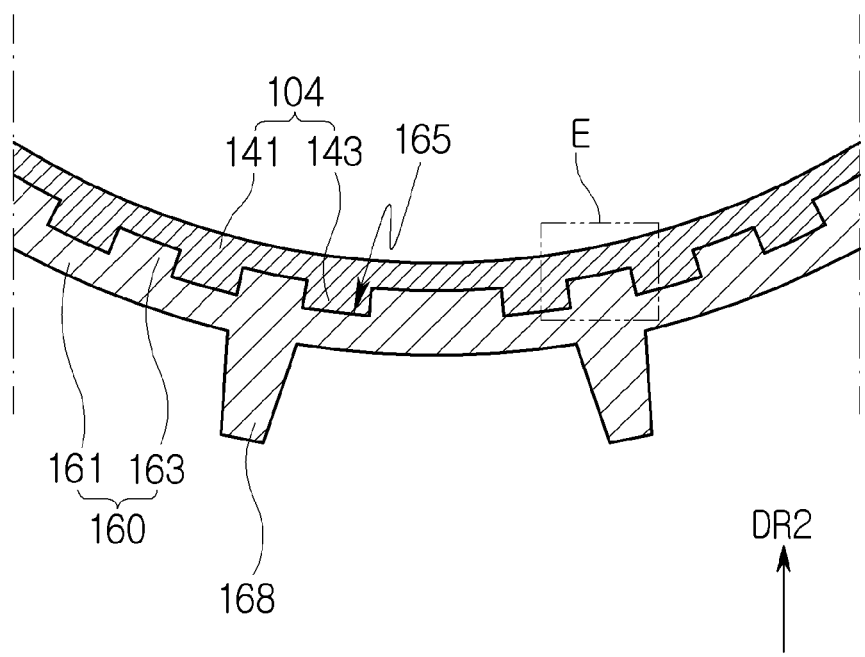
Figure 14:
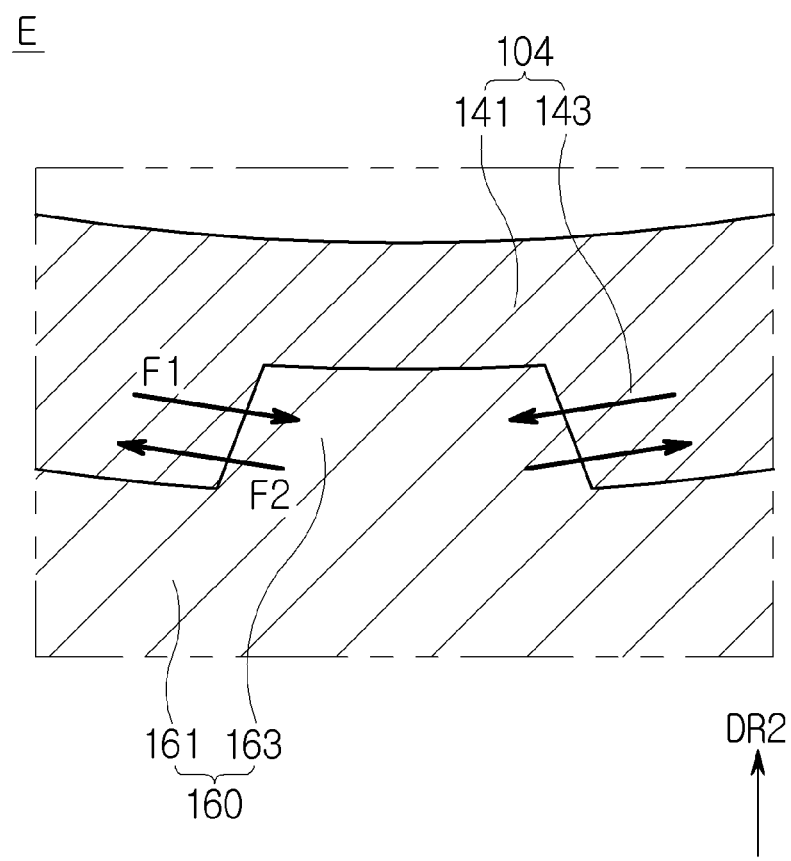
FIG. 14 is an enlarged view of a region E in FIG. 13, according to an embodiment of the present disclosure.

FIGS. 12 and 13 are views for describing coupling between a heat dissipation plate and a guide holder according to an embodiment. FIG. 14 is an enlarged view of a region E in FIG. 13, according to an embodiment of the present disclosure.

Referring to FIGS. 12 and 13, the first protrusion 143 of the heat dissipation plate 104 may be inserted in the space 165 formed in the guide holder 160. The first protrusion 143 inserted in the space 165 may be in contact with each of the second protrusions 163 of the adjacent guide holders 160.

As shown in FIG. 14, the heat dissipation plate 104 may have a predetermined resilience force F1, and the second protrusion 163 may have an elastic force F2 in the opposite direction to the resilience force F1. In more detail, as described with reference to FIG. 1, the heat dissipation plate 104 may be a curved heat dissipation plate 104, and the curved heat dissipation plate 104 may have a resilience force F1 to be straightened again as shown in FIG. 14. Due to the resilience force F1 of the curved heat dissipation plate 104 to be straightened again from the curved state, the display apparatus 100 (see FIG. 1) may not maintain its curvature.

Further, due to the resilience force F1 of the curved heat dissipation plate 104 to be straightened again from the curved state, the display apparatus 100 (see FIG. 1) cannot maintain the curvature thereof, thereby causing misalignment when the guide holder 160 (see FIG. 4) and the back cover 190 (see FIG. 4) are fastened.

However, in the display apparatus 100 (see FIG. 1) according to an embodiment, the elastic force F2 of the second protrusion 163 of the curved guide holder 160 offsets the resilience force F1 of the heat dissipation plate 104 because the first protrusion 143 of the heat dissipation plate 104 is inserted in the space 165 formed in the guide holder 160 even though the curved heat dissipation plate 104 has the resilience force F1 to be straightened again from the curved state, thereby maintaining the curvature of the display apparatus 100 (see FIG. 1). The curved heat dissipation plate 104 and the curved guide holder 160 may be curved in such a way that the long side 140S1 and the long side 160S1 curved, respectively. Therefore, it is advantageous to minimize the module failure of the display apparatus 100 (see FIG. 1), and minimize the alignment failure when the guide holder 160 (see FIG. 4) and the back cover 190 (see FIG. 4) are fastened to each other.

According to an embodiment, the sum of elastic forces F2 the plurality of second protrusions 163 have may be greater than the resilience force F1 of the heat dissipation plate 104 so that the elastic force F2 of the second protrusion 163 of the guide holder 160 can offset the resilience force F1 of the heat dissipation plate 104.

According to some other embodiments, the second protrusion 163 may include a material having a greater elastic force than the second base 161, but is not limited thereto. Alternatively, the second protrusion 163 may include the same material as the second base 161.

Below, the display apparatus according to another embodiment will be described.

Figure 15:
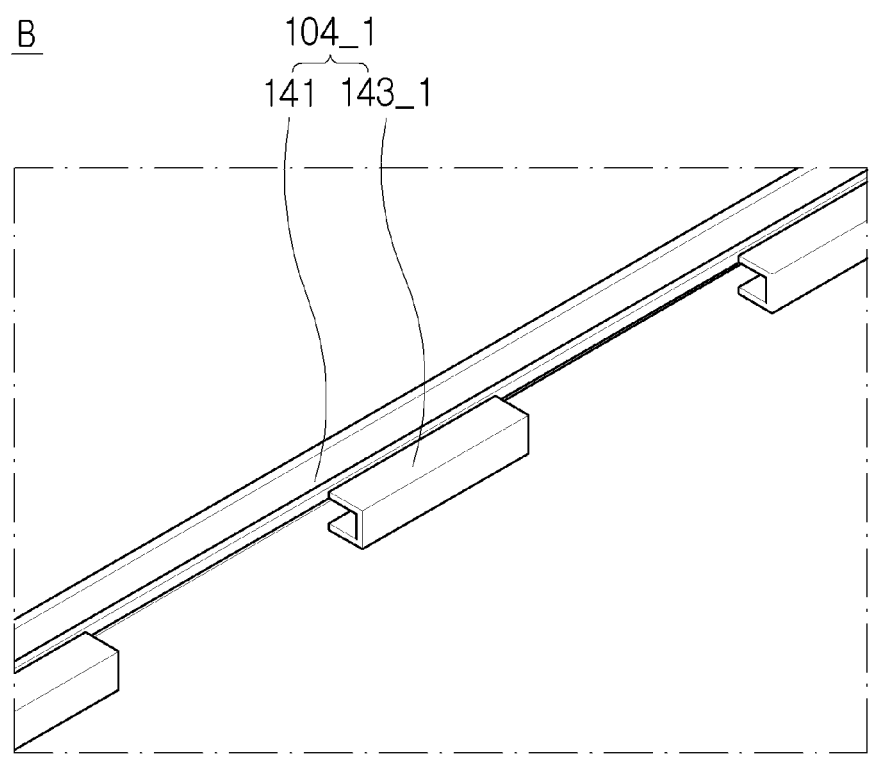
FIG. 15 is a perspective view of a heat dissipation plate according to another embodiment.
Figure 15:
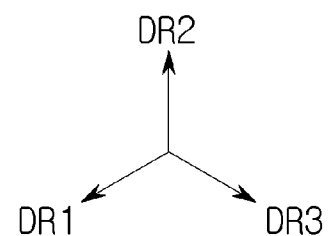

FIG. 15 is a perspective view of a heat dissipation plate according to another embodiment.

Referring to FIG. 15, a first protrusion 143_1 of a heat dissipation plate 104_1 according to this embodiment is different from the heat dissipation plate 104 of FIG. 8 in that the first protrusion 143_1 has a '⊏'-shape.

In more detail, the first protrusion 143_1 according to this embodiment may have a '⊏'-shape.

Other descriptions are the same as those described with reference to FIG. 8, and thus will not be described in detail.

Figure 16:
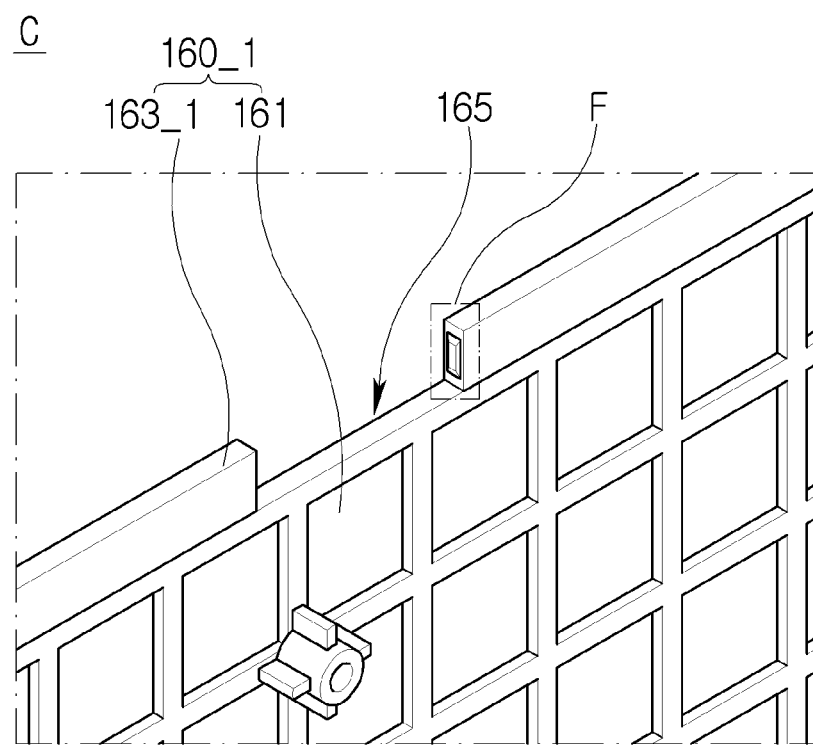
FIG. 16 is a perspective view of a guide holder according to another embodiment.
Figure 16:
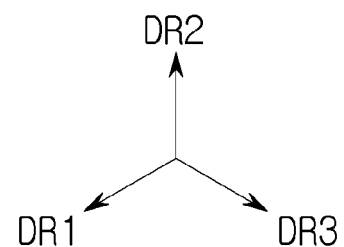
Figure 17:
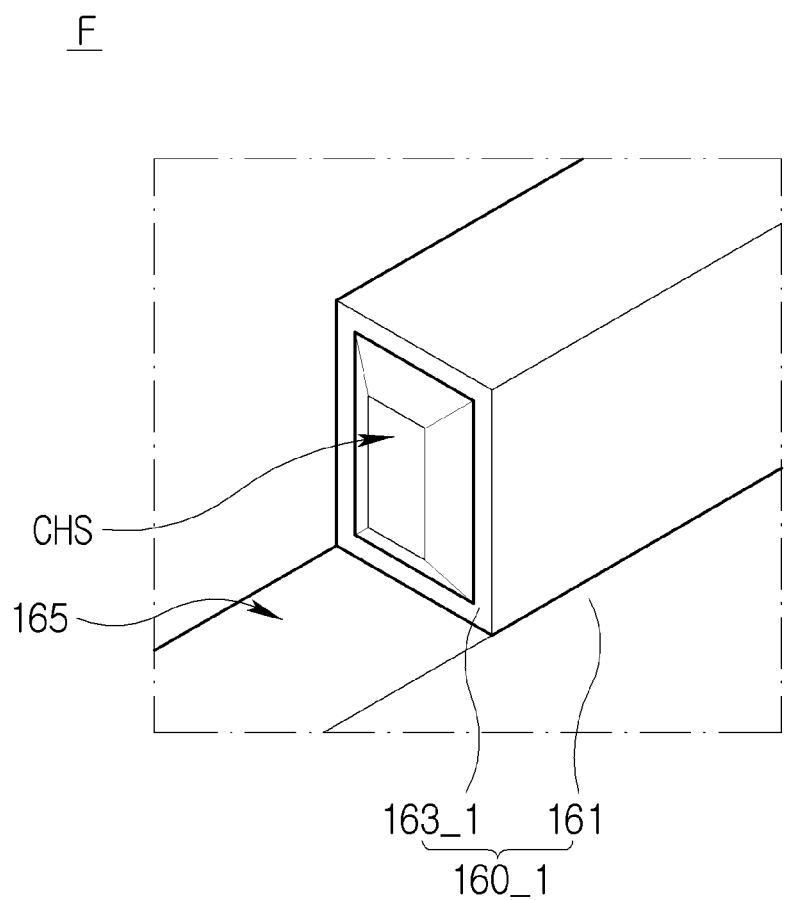
FIG. 17 is an enlarged view of a region F in FIG. 16, according to an embodiment of the present disclosure.

FIG. 16 is a perspective view of a guide holder according to another embodiment. FIG. 17 is an enlarged view of a region F in FIG. 16, according to an embodiment of the present disclosure.

Referring to FIGS. 16 and 17, a guide holder 160_1 according to this embodiment is different from the guide holder 160 shown in FIG. 9 in that a lateral side (facing the space 165) includes a chamfer surface CHS.

In more detail, the chamfer surface CHS may have a convex shape protruding toward the space 165 as shown in FIG. 17. For example, the chamfer surface CHS may have a trapezoidal cross-section.

The guide holder 160_1 according to this embodiment further includes the chamfer surface CHS, so that the first protrusion 143 can be caught in the chamfer surface CHS when the first protrusion 143 of the heat dissipation plate 104 is inserted in the space 165 of the guide holder 160_1, thereby improving coupling between the guide holder 160_1 and the heat dissipation plate 104.

Other descriptions are the same as those described with reference to FIG. 9, and thus will not be described in detail.

Figure 18:
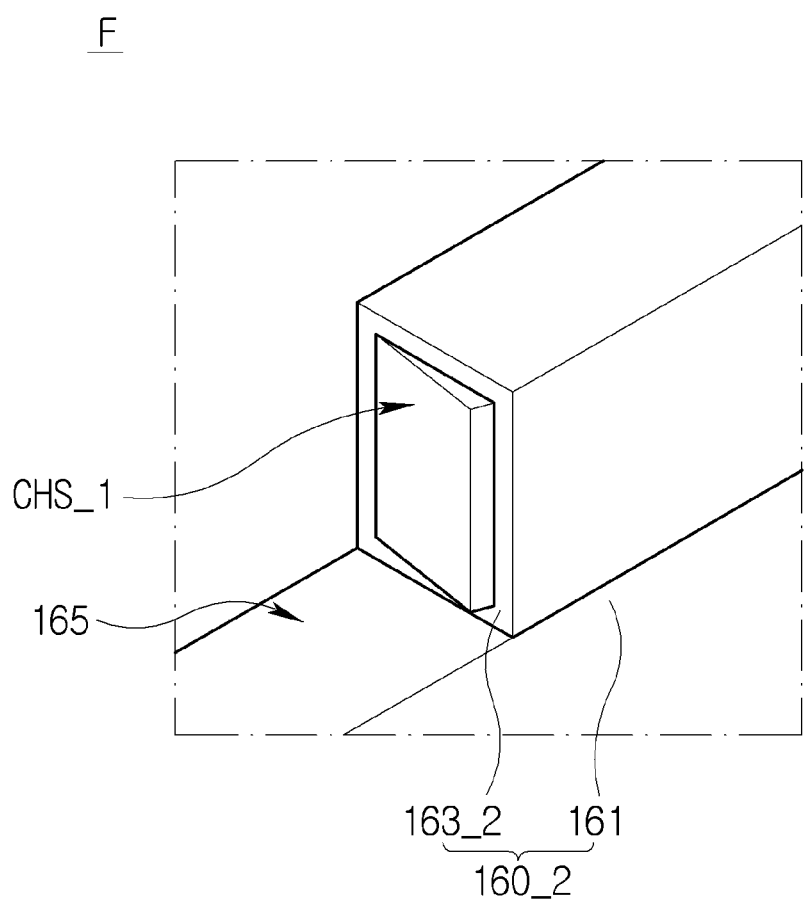
FIG. 18 is a view showing a chamfer surface of a guide holder according to still another embodiment.

FIG. 18 is a view showing a chamfer surface of a guide holder according to still another embodiment.

Referring to FIG. 18, a guide holder 160_2 according to this embodiment is different from the guide holder 160_1 shown in FIG. 17 in that a second protrusion 163_2 has a chamfer surface CHS_1 of which the width is gradually decreased from one side to the other side in the third direction DR3.

According to this embodiment, the guide holder 160_2 further includes the chamfer surface CHS_1, so that the first protrusion 143 is caught in the chamfer surface CHS_1 when the first protrusion 143 of the heat dissipation plate 104 is inserted in the space 165 of the guide holder 160_2, thereby improving coupling between the guide holder 160_2 and the heat dissipation plate 104.

Other descriptions are the same as those described with reference to FIG. 9, and thus will not be described in detail.

For example, a display apparatus may include: a display panel; a heat dissipation plate on a bottom of the display panel; and a guide holder on a bottom of the heat dissipation plate, wherein the heat dissipation plate includes a first base, and a first protrusion protruding toward the guide holder, and the guide holder includes a second base, and second protrusions protruding from an end portion of the second base.

A space may be formed between the second protrusions adjacent to each other.

The first protrusion may be inserted in the space.

The first protrusion may be in direct contact with the adjacent second protrusions.

The display apparatus may include a curved display apparatus, and each of the display panel, the heat dissipation plate, and the guide holder may be curved.

The heat dissipation plate may include a first long side edge extending along a first direction, and a first short side edge extending along a second direction intersecting the first direction, and the first protrusion may be formed in the first long side edge.

The guide holder may include a second long side edge extending along the first direction, and a second short side edge extending along the second direction, and the second protrusion and the space may be formed in the second long side edge.

The heat dissipation plate and the guide holder may be curved in such a way that the first long side edge and the second long side edge are curved, respectively.

The first protrusion may have a '┐'-shape.

The first protrusion may have a '⊏'-shape.

The display apparatus may further include a back cover on a bottom of the guide holder, wherein the guide holder and the back cover are coupled by a screw.

A display apparatus may include: a curved heat dissipation plate; and a curved guide holder on a bottom of the curved heat dissipation plate, wherein the curved heat dissipation plate includes a first base, and a first protrusion protruding toward the curved guide holder, and the curved guide holder includes a second base, and second protrusions protruding from an end portion of the second base.

The second protrusions adjacent to each other may be formed with a space therebetween, and the first protrusion may be inserted in the space.

The first protrusion may be in direct contact with the adjacent second protrusions.

The sum of elastic forces of the second protrusions may be greater than the resilience force of the curved heat dissipation plate.

The elastic force of the second protrusion may be greater than the elastic force of the second base.

The curved heat dissipation plate may include a first long side edge extending along a first direction, and a first short side edge extending along a second direction intersecting the first direction, the first protrusion may be formed in the first long side edge, the curved guide holder may include a second long side edge extending along the first direction, and a second short side edge extending along the second direction, and the second protrusion and the space may be formed in the second long side edge.

The curved heat dissipation plate and the curved guide holder may be curved in such a way that the first long side edge and the second long side edge are curved, respectively.

Although a few embodiments have been described in more detail with reference to the accompanying drawings, it will be understood by a person having ordinary knowledge in the art to which the disclosure pertains that the different embodiments can be made without departing from the technical spirit or features. Accordingly, the embodiments described above should be understood to be illustrative and non-limiting in all respects.

DESCRIPTION OF REFERENCE NUMERALS

100: display apparatus
101: cover window
102: adhesive member
150: display panel
103: back plate
104: heat dissipation plate
160: guide holder
180: control printed circuit board
190: back cover
250: polarization film
350: viewing angle control layer

What is claimed is:

1. A display apparatus comprising:
a display panel;
a heat dissipation plate on a bottom of the display panel; and
a guide holder on a bottom of the heat dissipation plate,
wherein the heat dissipation plate comprises a first base and a first protrusion that protrudes towards the guide holder, and the guide holder comprises a second base and second protrusions that protrude from an end portion of the second base.

2. The display apparatus of claim 1, further comprising:
a space between the second protrusions that are adjacent to each other.

3. The display apparatus of claim 2, wherein the first protrusion is inserted in the space.

4. The display apparatus of claim 3, wherein the first protrusion is in direct contact with the adjacent second protrusions.

5. The display apparatus of claim 3, wherein the display apparatus is a curved display apparatus, and the display panel, the heat dissipation plate, and the guide holder are curved.

6. The display apparatus of claim 5, wherein the heat dissipation plate comprises a first long side edge extending along a first direction, and a first short side edge extending along a second direction that intersects the first direction, and the first protrusion is formed in the first long side edge.

7. The display apparatus of claim 6, wherein the guide holder comprises a second long side edge extending along the first direction, and a second short side edge extending along the second direction, and the second protrusions and the space are formed in the second long side edge.

8. The display apparatus of claim 7, wherein the first long side edge of the heat dissipation plate and the second long side edge of the guide holder are curved.

9. The display apparatus of claim 1, wherein the first protrusion has a '┐'-shape.

10. The display apparatus of claim 1, wherein the first protrusion has a '⊏'-shape.

11. The display apparatus of claim 1, further comprising:
a back cover on a bottom of the guide holder, wherein the guide holder and the back cover are coupled by a screw.

12. A display apparatus comprising:
a curved heat dissipation plate; and
a curved guide holder on a bottom of the curved heat dissipation plate,
wherein the curved heat dissipation plate comprises a first base, and a first protrusion that protrudes towards the curved guide holder, and the curved guide holder comprises a second base and second protrusions that protrude from an end portion of the second base.

13. The display apparatus of claim 12, wherein the second protrusions that are adjacent to each other have a space therebetween, and the first protrusion is inserted in the space.

14. The display apparatus of claim 13, wherein the first protrusion is in direct contact with the adjacent second protrusions.

15. The display apparatus of claim 14, wherein a sum of elastic forces of the second protrusions is greater than a resilience force of the curved heat dissipation plate.

16. The display apparatus of claim 15, wherein an elastic force of the second protrusions is greater than an elastic force of the second base.

17. The display apparatus of claim 14, wherein
the curved heat dissipation plate comprises a first long side edge that extends along a first direction, and a first short side edge that extends along a second direction that intersects the first direction,
the first protrusion is formed in the first long side edge,
the curved guide holder comprises a second long side edge that extends along the first direction, and a second short side edge that extends along the second direction, and
the second protrusions and the space are formed in the second long side edge.

18. The display apparatus of claim 17, wherein the curved heat dissipation plate and the curved guide holder are curved in such that the first long side edge of the curved heat dissipation plate and the second long side edge of the curved guide holder are curved, respectively.

\* \* \* \* \*